(12) United States Patent
Jeon

(10) Patent No.: US 6,268,626 B1
(45) Date of Patent: Jul. 31, 2001

(54) DMOS FIELD EFFECT TRANSISTOR WITH IMPROVED ELECTRICAL CHARACTERISTICS AND METHOD FOR MANUFACTURING THE SAME

(75) Inventor: Chang Ki Jeon, Bucheon (KR)

(73) Assignee: Fairchild Korea Semiconductor Ltd. (KR)

( * ) Notice: Subject to any disclaimer, the term of this patent is extended or adjusted under 35 U.S.C. 154(b) by 0 days.

(21) Appl. No.: 09/478,800

(22) Filed: Jan. 7, 2000

(30) Foreign Application Priority Data

Jan. 20, 1999 (KR) .................................................. 99-1648

(51) Int. Cl.[7] .................................................. H01L 29/72
(52) U.S. Cl. .................. 257/335; 257/336; 257/404; 257/408; 257/288; 438/304
(58) Field of Search .................................. 257/335, 336, 257/404, 408, 288; 438/304

(56) References Cited

U.S. PATENT DOCUMENTS 6,133,607 * 10/2000 Funaki et al. ........................ 257/335

OTHER PUBLICATIONS

LDMOS Implementation by Large Tilt Implant In 0.6 $\mu$m BCD5 Process, Flash Memory Compatible C. Contiero et al., (1996, IEEE), pp 75–78.

* cited by examiner

Primary Examiner—Edward Wojciechowicz
(74) Attorney, Agent, or Firm—Rothwell, Figg, Ernst & Manbeck

(57) ABSTRACT

In a DMOS field effect transistor according to the present invention, a drift region of a first conductivity type is formed on a semiconductor substrate. A gate electrode is formed over the drift region, interposing a gate insulating layer between the drift region and the gate electrode. The gate electrode includes a gate conductive layer and a conductive spacer formed on the side wall of the gate conductive layer. A body region is formed to be self-aligned by the gate conductive layer. The source region is formed to be self-aligned by the conductive spacer. Therefore, a doping profile in a channel region of the body region has a form in which a uniform doping density value is maintained. Therefore, although the threshold voltage of the device is lowered by reducing the peak doping density, the density of impurities in the channel region is not decreased. Therefore, a punch-through characteristic is not deteriorated.

12 Claims, 8 Drawing Sheets

DMOS FIELD EFFECT TRANSISTOR WITH IMPROVED ELECTRICAL CHARACTERISTICS AND METHOD FOR MANUFACTURING THE SAME

BACKGROUND OF THE INVENTION

1. Field of the Invention

The present invention relates to a semiconductor device and a method for manufacturing the same, and more particularly, to a double diffused MOS (DMOS) field effect transistor with improved electrical characteristics and a method for manufacturing the same.

2. Description of the Related Art

DMOS field effect transistors are typically used for power devices which require a high voltage and fast switching and can be classified into a vertical type and a horizontal type according to the direction of current flow. The DMOS field effect transistor is manufactured using a planar diffusion technology. Namely, a p-type body region and n-type high density source regions are formed by a double-diffusion process in which ions are implanted through a window defined by a polysilicon gate and are drive-in-diffused.

FIG. 1 is a sectional view showing such a DMOS field effect transistor. The device shown in FIG. 1 is an example of a vertical-type DMOS field effect transistor in which current flows in a vertical direction.

Referring to FIG. 1, an n-type high density semiconductor substrate 10 is used as a drain region. An n-type low density epitaxial layer 11 formed on the n-type high density semiconductor substrate is used as a drift region. A p-type body region 12 is formed within the epitaxial layer 11. A p-type high density sink region 13 and an n-type high density source region 14 are formed to be adjacent to each other within the body region 12. A gate electrode 16 is formed over the channel region of the body region 12, with a gate insulating layer 15 interposed between the gate electrode 16 and the body region 12. A source electrode 18 is formed to be electrically connected to the source region 14, and a drain electrode 19 is formed to be electrically connected to the semiconductor substrate 10. An insulating layer 17 for insulating the gate electrode 16 from the source electrode 18 is formed on the gate electrode 16.

The body region 12 is formed by implanting p-type impurity ions using the gate electrode 16 as an ion implantation mask and by drive-in-diffusing the implanted p-type impurity ions. The source region 14 is formed by implanting n-type impurity ions using the gate electrode 16 and a mask pattern (not shown) as ion implantation masks and drive-in-diffusing the implanted n-type impurity ions.

FIG. 2 is a sectional view showing the region A of FIG. 1, i.e., enlarged surfaces of the source region 14 and the body region 12. FIG. 3 is a graph showing a doping profile along the line B–B' of FIG. 2.

Referring to FIG. 2, the depth of diffusion of impurity ions in the horizontal direction is about 70% of the diffusion depth in the vertical direction. Namely, when the diffusion depth of the body region 12 in the vertical direction is $D_p$, the diffusion depth in the horizontal direction is 0.7 $D_p$. When the diffusion depth of the source region 14 in the vertical direction is $D_s$, the diffusion depth in the horizontal direction becomes 0.7 $D_s$. Therefore, when a voltage having a magnitude no less than the threshold voltage for the device is applied to the gate electrode 16, the length of a formed channel is 0.7($D_p$–$D_s$).

As shown in FIG. 3, in a conventional DMOS field effect transistor, the doping density of the impurity ions in the body region 12 and the source region 14 becomes less as the horizontal depth of diffusion of the body region 12 and the source region 14 becomes larger. In particular, the peak doping density (marked with an arrow in FIG. 3) of the p-type impurity ions is shown due to compensation with the n-type impurity ions implanted into the source region 14 in a portion adjacent to the source region 14 in the body region 12. It is well known that the peak doping density greatly affects the threshold voltage of a device. The threshold voltage becomes larger as the peak doping density becomes larger.

When the source electrode of the device is grounded and a positive voltage is applied to the drain electrode, the junction between the p-type body region 12 and the n-type epitaxial layer 11 is reverse biased. Accordingly, depletion occurs in the two regions 12 and 14. When the body region 12 is entirely depleted, the n-type source region and the n-type epitaxial layer are shorted. Accordingly, punch-through breakdown occurs. In general, since the depletion depth becomes smaller as the doping density becomes higher, the doping density in the channel should be increased in order to increase the punch-through breakdown voltage. However, as mentioned above, when the doping density in the channel is increased, the peak doping density in the body region 12 is increased. Therefore, the threshold voltage is increased, thus deteriorating the electrical characteristics of the device.

SUMMARY OF THE INVENTION

To solve the above problem, it is an objective of the present invention to provide a DMOS field effect transistor with a lowered peak doping density in a channel region and maintaining an impurity density for maintaining a high punch-through breakdown characteristic voltage.

It is another objective of the present invention to provide a method for manufacturing the above-mentioned DMOS field effect transistor.

Accordingly, to achieve the first objective, a DMOS field effect transistor according to an embodiment of the present invention comprises a high density drain region of a first conductivity type. A drift region of the same conductivity type is formed on the drain region. A gate electrode is formed over the drift region, with a gate insulating layer interposed between the drift region and the gate electrode. The gate electrode includes a gate conductive layer and a conductive spacer formed on the side wall of the gate conductive layer. A body region is formed to have a second conductivity type, which is opposite to the first conductive type, on part of the drift region so that the doping density under the conductive spacer is maintained to be uniform along the direction in which current flows. High density source regions of a first conductive type are formed in part of the body region. A source electrode and a drain electrode are formed to be electrically connected to the source region and the drain region, respectively.

Here, the body region is formed to be self-aligned on the gate conductive layer. The source regions are formed to be self-aligned in the conductive spacer.

To achieve the first objective, a DMOS field effect transistor according to another embodiment of the present invention comprises a buried layer and a drift region of a first conductivity type, sequentially formed on a semiconductor substrate. A gate electrode is formed over the drift region, with a gate insulating layer interposed between the drift region and the gate electrode. The gate electrode includes a gate conductive layer and a conductive spacer formed on the side wall of the gate conductive layer. A body region is formed to have a second conductivity type, which is opposite to the first conductive type, on part of the drift region so that the doping density under the conductive spacer is maintained to be uniform along the direction in which current flows. High density source regions of a first conductive type are formed in part of the body region. A sink region of a first conductive type is formed to be separated from the body region by a predetermined distance, to cross the drift region in a vertical direction, and to overlap part of the surface of the buried layer. A high density drain region of a first conductivity type is formed on a predetermined region of the surface of the sink region. A source electrode and a drain electrode are formed to be electrically connected to the source region and the drain region, respectively.

To achieve the second objective, in a method for manufacturing a DMOS field effect transistor according to the present invention, a high density drain region of a first conductivity type is formed using a semiconductor substrate. A drift region of a first conductivity type is formed on the drain region. A gate insulating layer is formed on the drift region. A gate conductivity layer is formed on the gate insulating layer. A body region of a second conductivity type which is opposite to the first conductivity type is formed using the gate conductive layer as an ion implantation mask. A conductive spacer is formed on the side wall of the gate conductive layer. A mask layer pattern separated from the conductive spacer by a predetermined distance is formed. A high density source region of a first conductivity type is formed using the conductive spacer and the mask layer pattern as ion implantation masks. A source electrode and a drain electrode are formed so as to be electrically connected to the source region and the drain region, respectively.

The step of forming the body region preferably comprises the steps of implanting impurity ions of a second conductivity type using the gate conductive layer as an ion implantation mask and drive-in-diffusing the impurity ions at a predetermined temperature for a predetermined time. Here, the predetermined temperature is preferably 950° C. and the predetermined time is preferably 60 minutes.

The step of forming the conductive spacer preferably comprises the steps of forming an oxide layer on the gate conductive layer, forming a conductive material layer on the entire surface of the structure on which the oxide layer is formed, and forming a conductive spacer so as to be attached to the side wall of the gate conductive layer by etching back the conductive material layer using the oxide layer as an etching stopper. Here, the gate conductive layer and the conductive spacer are preferably formed of a doped polysilicon layer.

The method preferably further comprises the step of forming a high density source region of a second conductivity type in the body region to be adjacent to the high density source regions and to contact the source electrode in a predetermined region.

According to the DMOS field effect transistor of the present invention and the method for manufacturing the same, it is possible to make the density profile in the channel region in the body region have a form in which the peak density value is maintained to be uniform. Therefore, it is possible to reduce the peak doping density value without reducing the density of the impurities over the entire channel region. Accordingly, it is possible to reduce the threshold voltage of the device without weakening the punch-through ruggedness of the device. Furthermore, since it is possible to control the length of a channel by controlling the length of the second gate electrode, it is possible to easily form a short channel of a desired length which is within the limits of not affecting the punch-through characteristic.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
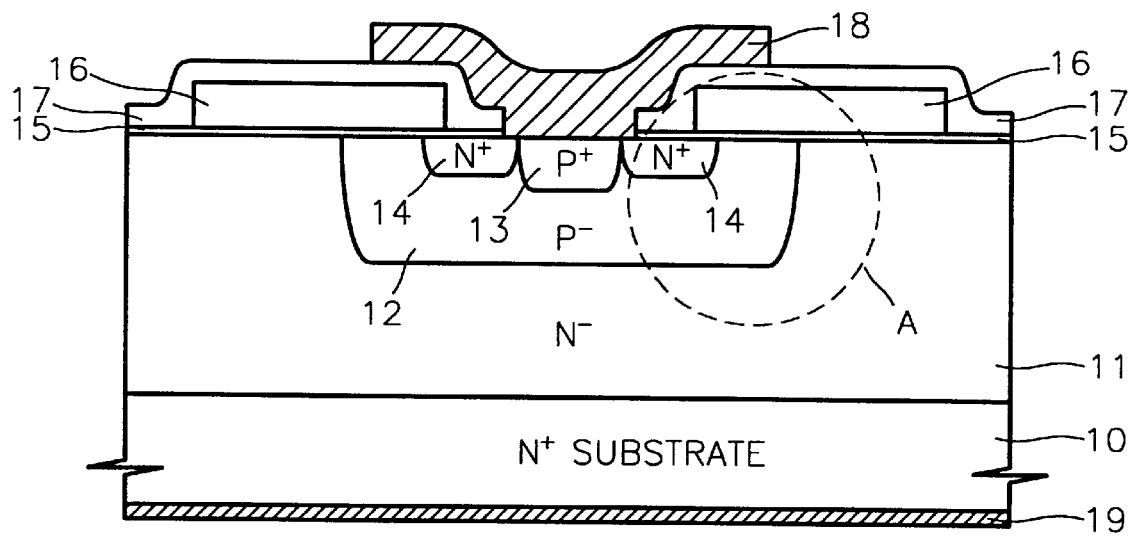
FIG. 1 (Prior Art) is a sectional view showing a general DMOS field effect transistor.
Figure 2:
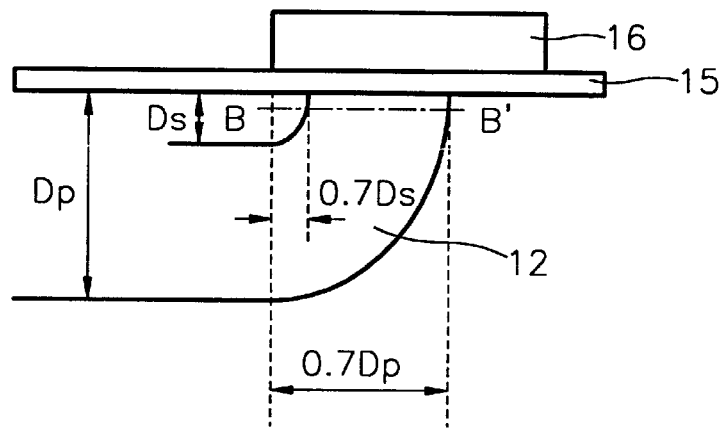
FIG. 2 (Prior Art) is an enlarged view of the region A in FIG. 1.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their description will be omitted.

Figure 4:
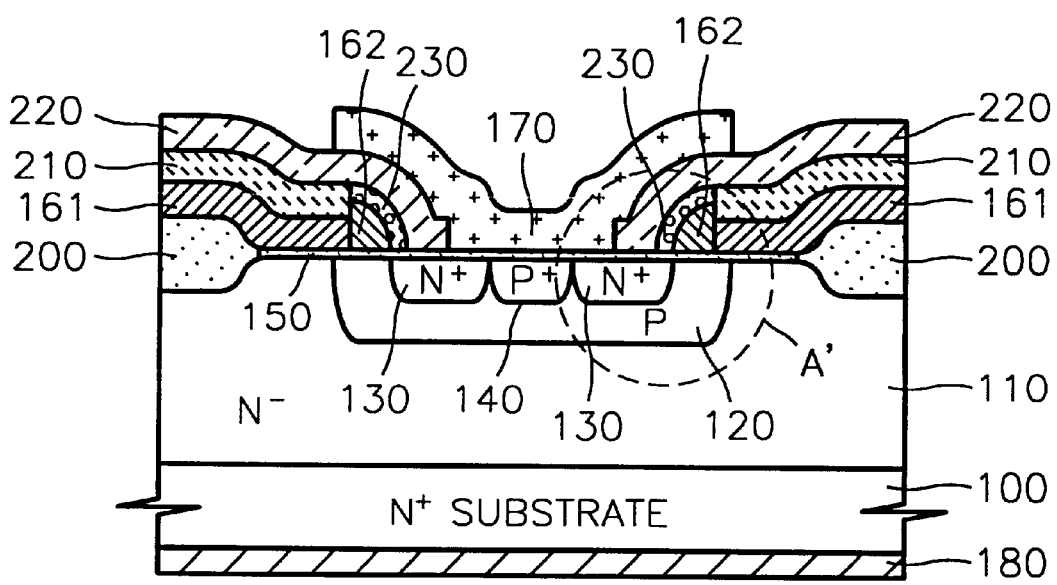
FIG. 4 is a sectional view showing a DMOS field effect transistor according to the present invention.
Figure 5:
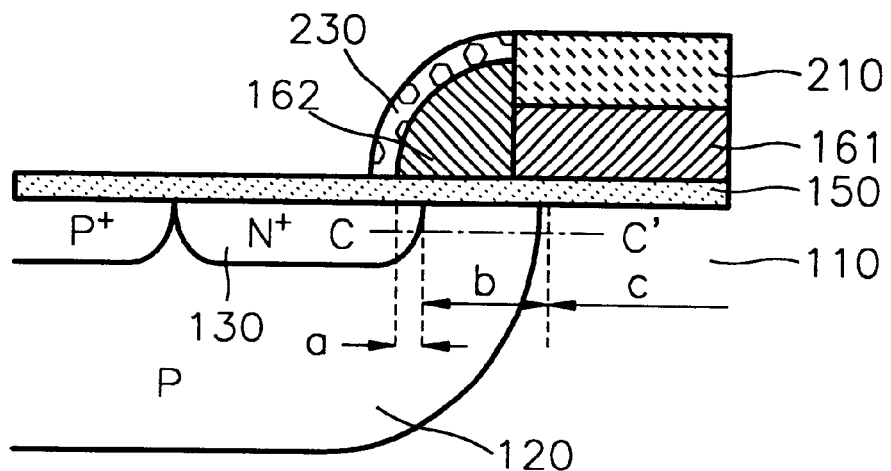
FIG. 5 is an enlarged view of the part A' in FIG. 4.

FIG. 4 is a sectional view showing a DMOS field effect transistor according to a preferred embodiment of the present invention. In the embodiment, a vertical type DMOS field effect transistor will be taken as an example. FIG. 5 is an enlarged view of the region A' of FIG. 4.

Referring to FIGS. 4 and 5, an n-type low density drift region 110 is formed on an n-type high density semiconductor substrate 100. The semiconductor substrate 100 is used as a drain region. The drift region 110 can be formed by growing an epitaxial layer on the semiconductor substrate 100. A p-type body region 120 is formed within the drift region 110. An n-type high density source regions 130 and a p-type high density sink region 140 are formed to be adjacent to each other within the body region 120. A gate electrode is formed over the drift region 110, with a gate insulating layer 150 interposed therebetween. The gate electrode includes a gate conductive layer 161 and a conductive spacer 162 formed on the sidewall of the gate conductive layer 161. A channel region is formed on the surface of the body region 120 by the gate conductive layer 161 and the conductive spacer 120 under a certain condition. As mentioned hereinafter, the gate conductive layer 161 is used as a self aligned ion implantation mask for forming the body region 120. The conductive spacer 162 is used as a self aligned ion implantation mask for forming the source region 130. The doping profile in the channel region under the surface of the body region 120 has a form in which a uniform doping density value is maintained in a predetermined section by the implantation of impurity ions using the gate conductive layer 161 as an ion implantation mask. Also, since the source region 130 is formed by implanting impurity ions using the conductive spacer 162 as the ion implantation mask, the actual length of the channel is almost the same as that of the conductive spacer 162. A source electrode 170 and a drain electrode 180 are formed to be electrically connected to the source region 130 and the semiconductor substrate 100, respectively. The gate conductive layer 161 and the conductive spacer 162 are electrically insulated from the source electrode 170 by an insulating layer 220. In FIG. 4, reference numeral 200 denotes a field oxide layer for isolation. Reference numerals 210 and 230 denote oxide layers.

Figure 6:
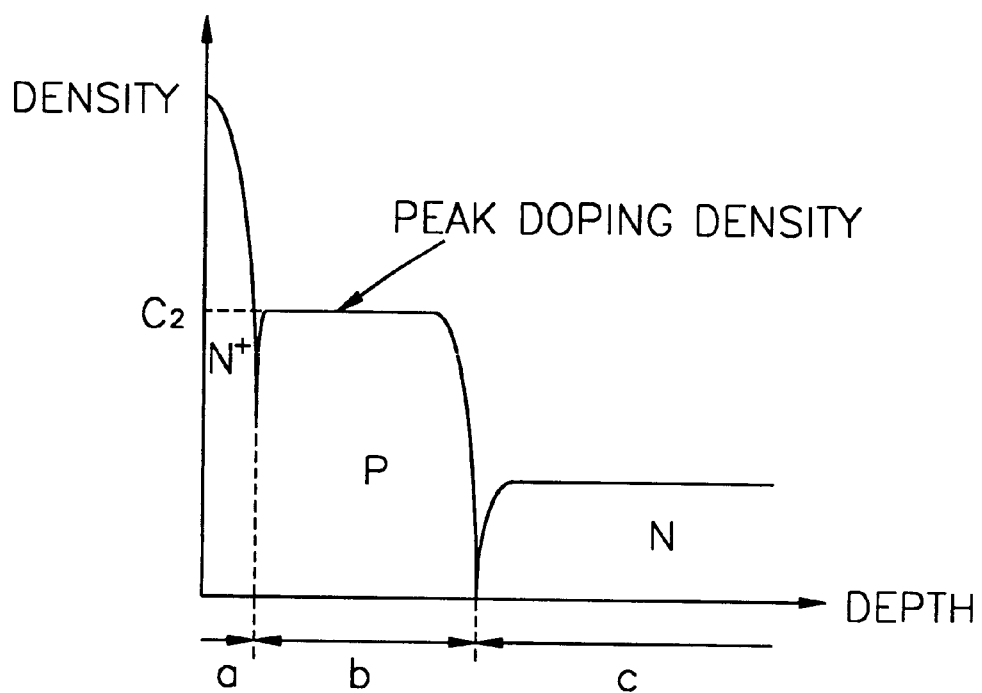
FIG. 6 shows an impurity density profile, taken along the ling C–C' of FIG. 5.

FIG. 6 is a graph showing a doping profile taken along the ling C–C' of FIG. 5.

Referring to FIGS. 5 and 6, at the edge (a of FIGS. 5 and 6) of the source region 130, which is partially overlapped by the conductive spacer 162, the n-type impurity ions have a high density. The density of the n-type impurity ions gradually decreases due to the diffusion of the body region 120 towards a junction formed between the source region 130 and the body region 120. The doping density of the channel region (b of FIGS. 5 and 6) formed under the surface of the body region 120 has a uniform value. Namely, since the channel region under the gate conductive layer 161 is formed by diffusion, it shows a doping profile having a slope. However, since the channel region under the conductive spacer 162 is not formed by diffusion but by implanting impurity ions, it shows a uniform doping profile. In this case, although the peak doping density is lower than in a conventional technology, it is possible to maintain a high total impurity density in the channel region, since the same peak doping density value is maintained in the channel region. Therefore, the punch-through breakdown voltage characteristic of the device is not deteriorated since the total impurity density over the entire channel region is not reduced although the threshold voltage of the device is lowered by reducing the amount of the implanted impurity ions for forming the body region, thus lowering a peak doping density value $C_2$ in comparison to the conventional peak doping density value $C_1$ of FIG. 3. Furthermore, it is possible to form a short channel without deteriorating the punch-through breakdown voltage characteristic of the device by controlling the length of the conductive spacer 162. The density of the impurities in the drift region 110 (c of FIGS. 5 and 6) is the same as that in the conventional technology.

The electrical characteristics of the device which depend on the density profile of the DMOS field effect transistor according to the present invention will be analyzed with reference to reference numerals.

First, Equation 1 represents the threshold voltage in the MOS field effect transistor.

$$V_{th} = (-Q_{ss} - Q_{SDmax})T_{ox} + \phi_{MS} + 2\psi_F \quad (1)$$

wherein $V_{th}$, $Q_{ss}$, $Q_{SDmax}$, $T_{ox}$, $\phi_{MS}$, and $\psi_F$ represent the threshold voltage, the positive interface charge density per unit area, the peak density between a source and a drain, the thickness of a gate insulating layer, the difference in a work function between a gate electrode and silicon, and the Fermi potential of the body region, respectively.

As shown in the Equation 1, the threshold voltage $V_{th}$ is lowered as the peak density $Q_{SDmax}$ between the source and the drain corresponding to the peak doping density in the channel of the DMOS field effect transistor becomes lower. When the threshold voltage $V_{th}$ of the device is lowered, power consumption is reduced and on resistance and switching speed are improved.

Equation 2 represents the on resistance of the device. Equation 3 represents the switching speed of the device.

$$R_{dson} = \frac{L(\mu_n C_{ox} W)}{V_G - V_{th}} \quad (2)$$

wherein $R_{dson}$, L, $\mu_n$, $C_{OX}$, W, and $V_G$ denote the on resistance between the drain and the source of the device, the length of the channel, the mobility of electrons, the capacitance of the gate insulating layer, the channel width, and the applied gate voltage, respectively.

$$\omega_{max} = 2\pi f_{max} = \frac{\mu_n |V_G - V_\theta|}{L_2} \quad (3)$$

wherein $\omega_{max}$ and $f_{max}$ denote the maximum angular velocity and the maximum frequency, respectively.

Figure 3:
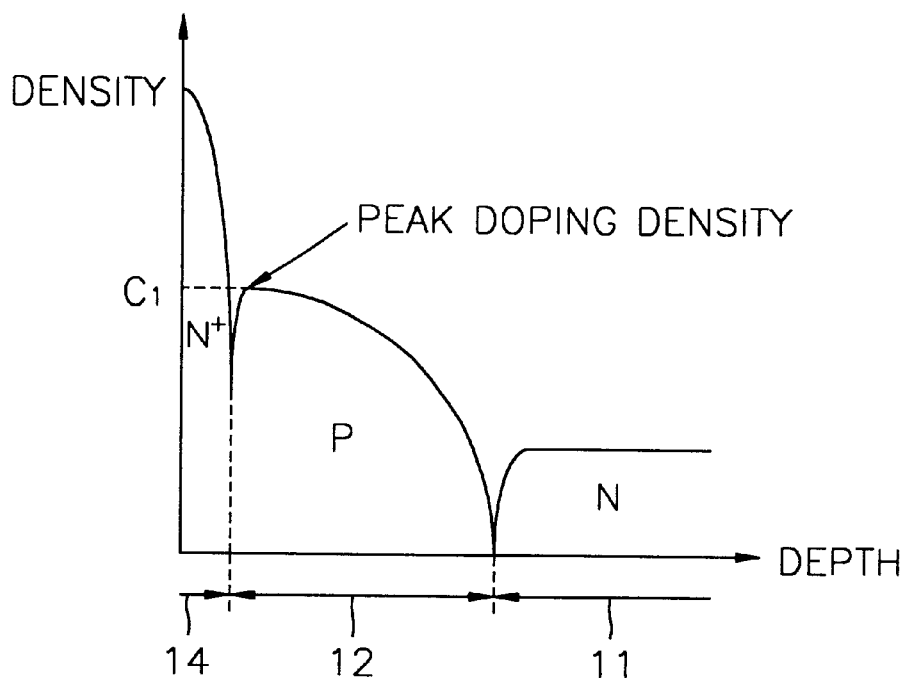
FIG. 3 (Prior Art) is a graph showing an impurity density profile taken along the line B–B' of FIG. 2.

As shown in the Equation 2, in the MOS field effect transistor according to the present invention, since it is possible to form the channel length L to be relatively shorter than in the conventional case without deteriorating the punch-through breakdown voltage characteristic of the device, it is possible to reduce the resistance $R_{dson}$ between the drain and the source when the device is turned on. Also, as shown in FIG. 3, since the channel length L is short and the threshold voltage $V_{th}$ is low, the maximum angular velocity $\omega_{max}$ increases. Accordingly, the switching speed of the device becomes higher.

As mentioned above, the present invention can also be applied to horizontal DMOS field effect transistors and is not limited to the vertical DMOS field effect transistor. Also, the vertical DMOS field effect transistor can have various external structures. For example, a high density buried layer can be formed between a semiconductor substrate of a predetermined conductive type and an epitaxial layer. The n-type sink region which overlaps some of the buried layer can be formed across the epitaxial layer in a vertical direction. In this case, the drain region is formed on a surface of the n-type sink region.

FIGS. 7 through 17 are sectional views for describing in detail the method for manufacturing the DMOS field effect transistor according to an embodiment of the present invention. A DMOS field effect transistor, the conductive type of which is the n-type, is taken as an example. However, the present invention can be applied to a vertical DMOS field effect transistor of another type or the horizontal DMOS field effect transistor.

Figure 7:
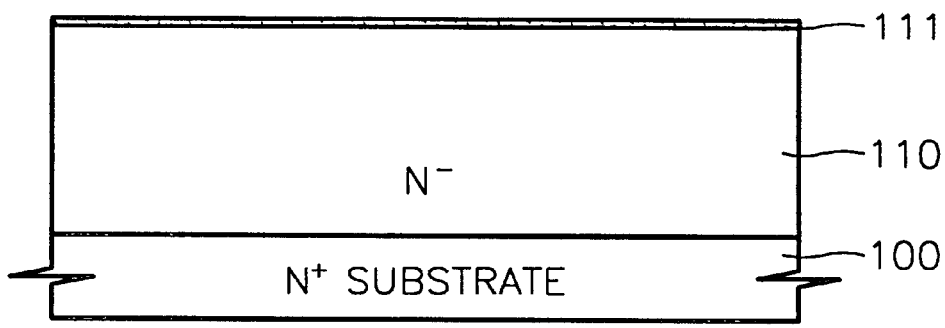
FIGS. 7 through 17 are sectional views describing a method for manufacturing the DMOS field effect transistor according to the present invention.

Referring to FIG. 7, an n-type high density semiconductor substrate 100 is provided. The semiconductor substrate 100 is used as a drain region. An n-type low density drift region 110 is formed on the semiconductor substrate 100. The drift region 110 can be directly formed on the semiconductor substrate 100 by an epitaxial growth technology and can also be formed using a wafer fusion technology. When the wafer fusion technology is used, after implanting n-type impurities into a wafer separate from the semiconductor substrate 100, the semiconductor substrate 100 is fused to the n-type doped wafer. A first oxide layer 111 is formed on the drift region 110. The first oxide layer 111 is a thermal oxide layer, the thickness of which is about 1,000 Å.

Figure 8:
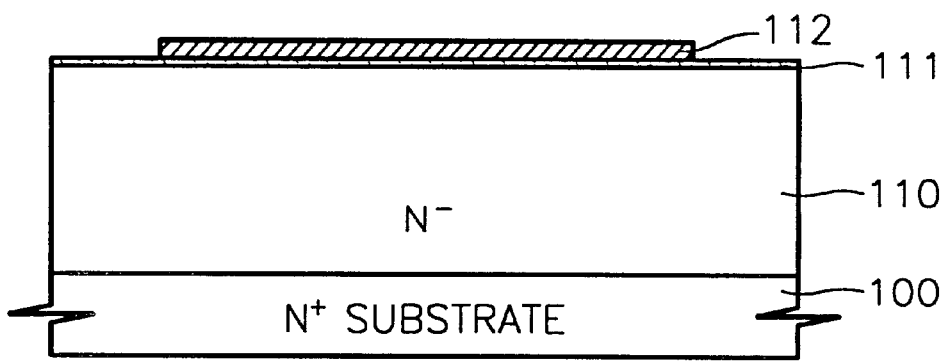

Referring to FIG. 8, a nitride layer pattern 112 is formed on the first oxide layer 11. The nitride layer pattern 112 is used as a growth stopper of the first oxide layer 111. The nitride layer and a photoresist layer are sequentially formed on the first oxide layer 111. Then, a photoresist layer pattern is formed by performing exposure and development on the resultant structure using a general photolithography method. The nitride layer is patterned by etching the nitride layer using the photoresist layer pattern as the etching mask. Subsequently, the photoresist layer pattern is removed.

Figure 9:
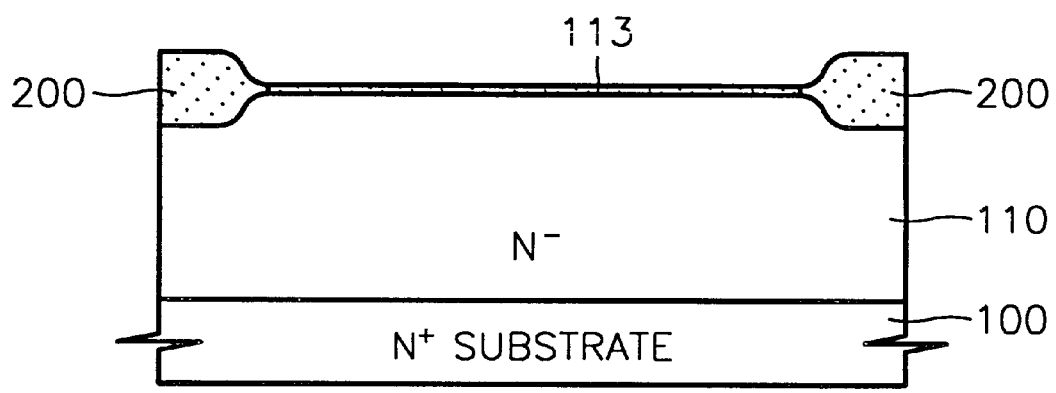

Referring to FIG. 9, the first oxide layer 111 of FIG. 8 is locally grown using the nitride layer pattern 112 of FIG. 8 as the growth stopper of the first oxide layer 111 of FIG. 8. Then, as shown in FIG. 9, a field oxide layer 200 is formed in a portion exposed by the nitride layer pattern 112 of FIG. 8. The nitride layer pattern 112 of FIG. 8 is removed after forming the field oxide layer 200. In order to remove the defects of the first oxide layer 111 of FIG. 8 generated by the nitride layer pattern 112 of FIG. 8, a second oxide layer 113 is formed after performing a general sacrificial oxidation process [in order to remove the defects of the first oxide layer 111 of FIG. 8 generated by the nitride layer pattern 112 of FIG. 8]. Some of the second oxide layer 113 is used as the gate insulating layer.

Figure 10:
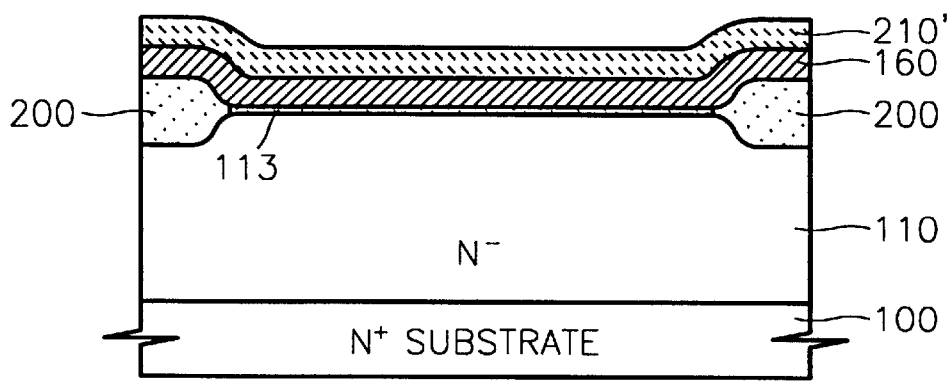

Then, referring to FIG. 10, gate conductive layers such as a doped polysilicon layer 160 and a third oxide layer 210' are sequentially formed on a field oxide layer 200 and the second oxide layer 113. The doped polysilicon layer 160 is for forming the gate electrode. The third oxide layer 210' is used as an etching stopper in a subsequent etch-back process.

Figure 11:
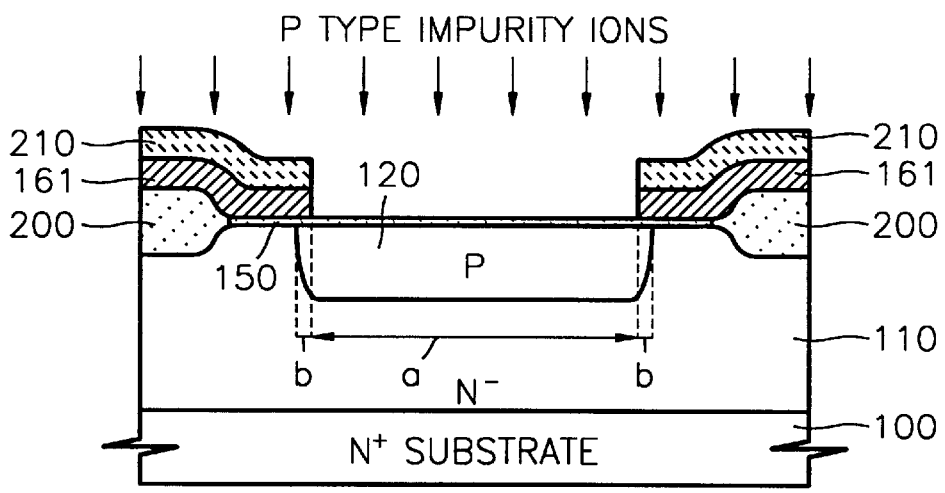

Then, referring to FIG. 11, a gate conductive layer pattern 161 and a third oxide layer pattern 210 are formed by patterning the doped polysilicon layer 160 of FIG. 10 and the third oxide layer 210' of FIG. 10. The oxide layer under the gate conductive layer pattern 161 is used as the gate insulating layer 150. The gate conductive layer pattern 161 and the third oxide layer pattern 210 have the same aperture. P-type impurity ions for forming the body region are implanted through the aperture. A p-type body region 120 is formed by a drive-in diffusion process, in which an annealing process is performed preferably at a temperature of about 950° C. for about 60 minutes. What is important here is that a uniform value of peak doping density is maintained since the impurity density in the section a is determined by ion implantation. Meanwhile, the impurity density becomes lower as the diffusion depth becomes larger in a section b in which the impurity ions are diffused by the drive in diffusion process. Since the drive-in diffusion process is performed at a lower temperature for a shorter time than in the conventional case, the diffusion depth becomes less than in the conventional case. Therefore, as described with reference to FIG. 6, it is possible to maintain the peak doping density to be uniform in the channel under the surface of the body region 120 over a most section. In this case, it is possible to obtain a desired value of the peak doping density by controlling the amount of implantation of the impurity ions.

Figure 12:
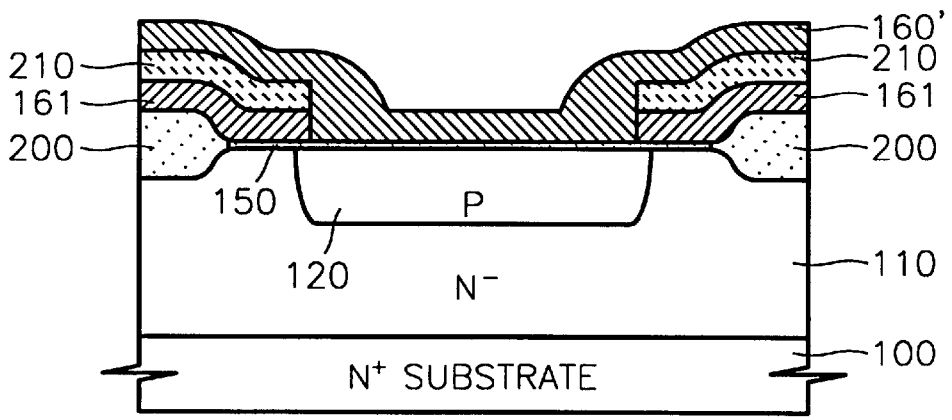

Referring to FIG. 12, polysilicon layer 160' is formed over the entire surface. If necessary, it is possible to perform a doping process after forming the polysilicon layer. The doped polysilicon layer 160' is for forming a conductive spacer. The conductive spacer is used as a part of the gate electrode as well as an ion implantation mask for forming the source region.

Figure 13:
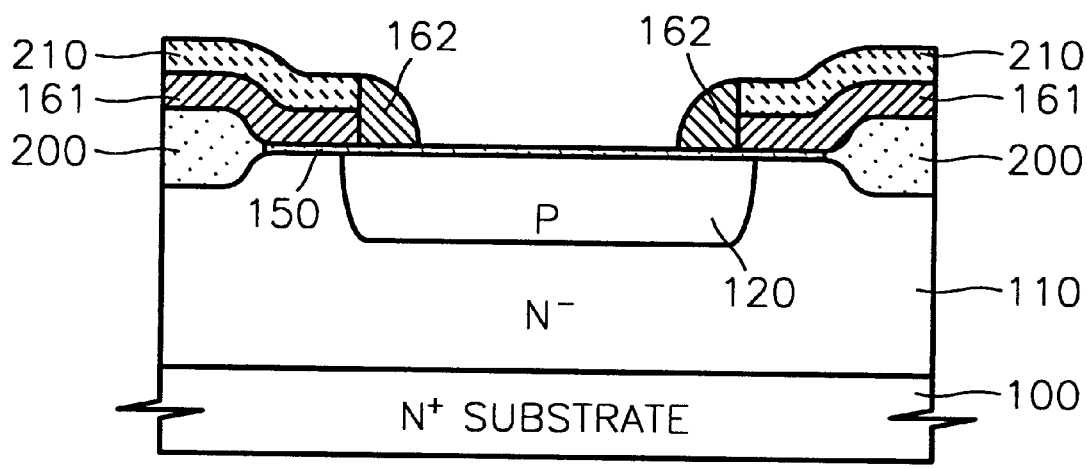

Referring to FIG. 13, a conductive spacer 162 is formed by etching back the entire surface of the doped polysilicon layer 160' of FIG. 12. The channel length is determined by the conductive spacer 162 because the conductive spacer 162 is used as the ion implantation mask for forming the source region. Since the density of the impurities in the body region 120 under the conductive spacer 162 is determined by the ion implantation rather than the diffusion, it is possible to maintain the density to be uniform. The third oxide layer pattern 210 is used as the etch stopper in performing the etch back process.

Figure 14:
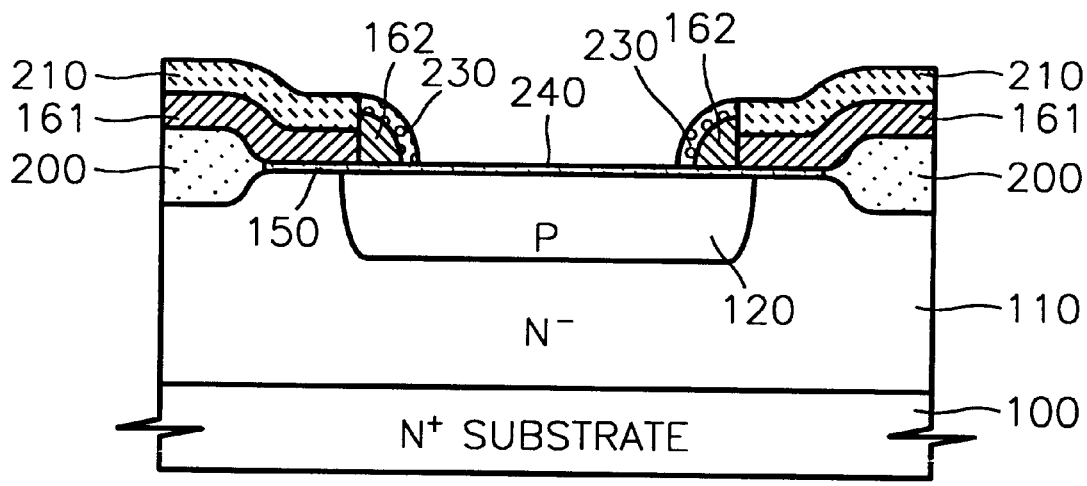

Referring to FIG. 14, a fourth oxide layer 240 is formed on a portion from which the oxide layer was removed by the etch-back process, by performing an oxidation process. The fourth oxide layer 240 is used as a buffer layer for ion implantation. Since the conductive spacer 162 is oxidized by the oxidation process, an oxide layer 230 is formed on the surface of the conductive spacer 162.

Figure 15:
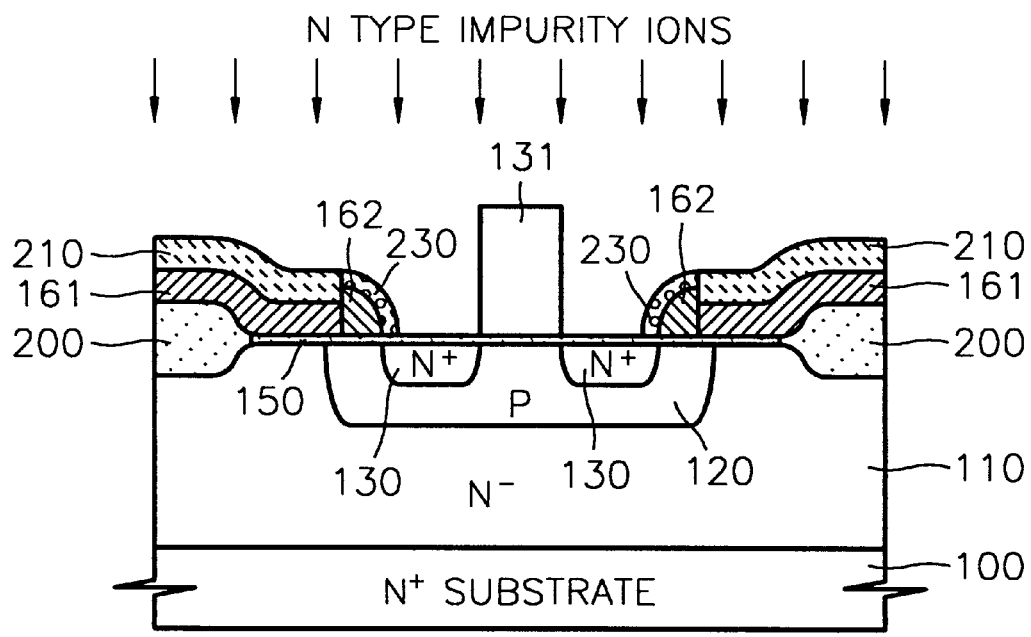

Referring to FIG. 15, a mask pattern such as a photoresist layer pattern 131, is formed to be used together with the conductive spacer 162 as the ion implantation mask for forming the source regions 130. Namely, after coating the photoresist layer on the entire surface, the photoresist layer pattern 131 is formed by performing exposure and development on the photoresist layer using a well-known photolithography process. Subsequently, n-type high density source regions 130 are formed by implanting a high density of n-type impurity ions using the conductive spacer 162 and the photoresist layer pattern 131 as ion implantation masks.

Figure 16:
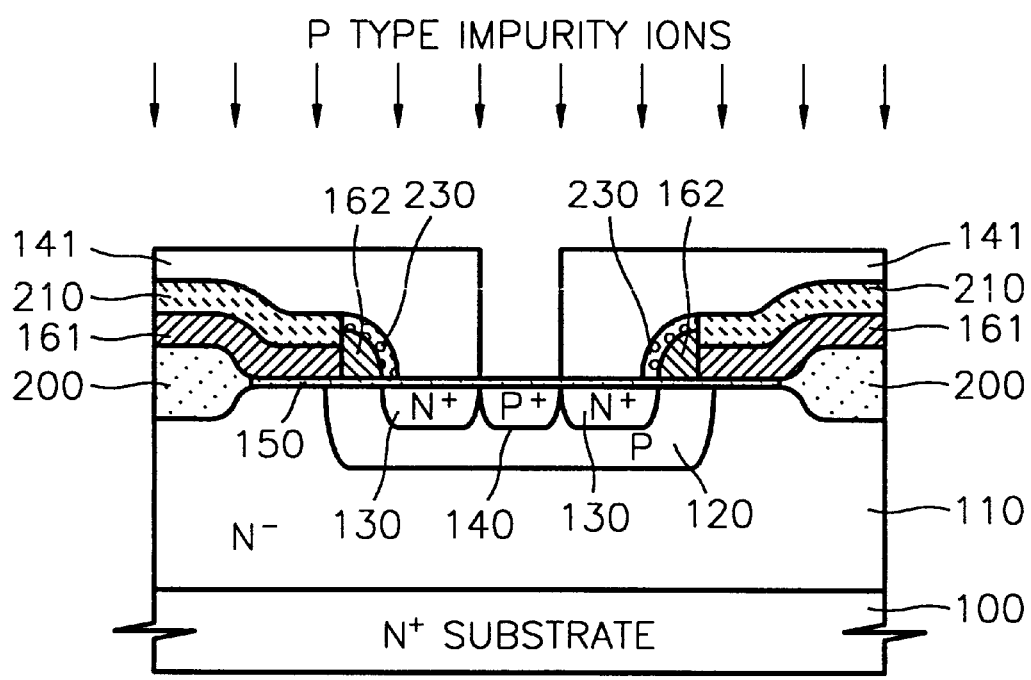

Referring to FIG. 16, a p-type high density source region 140 for an ohmic contact with the source electrode is formed after removing the photoresist layer pattern 131 of FIG. 15. At this time, a photoresist layer pattern 141 is formed as an ion implantation mask using the well-known lithography process as mentioned above. The p-type high density source region 140 is formed by implanting a high density of p-type impurity ions.

Figure 17:
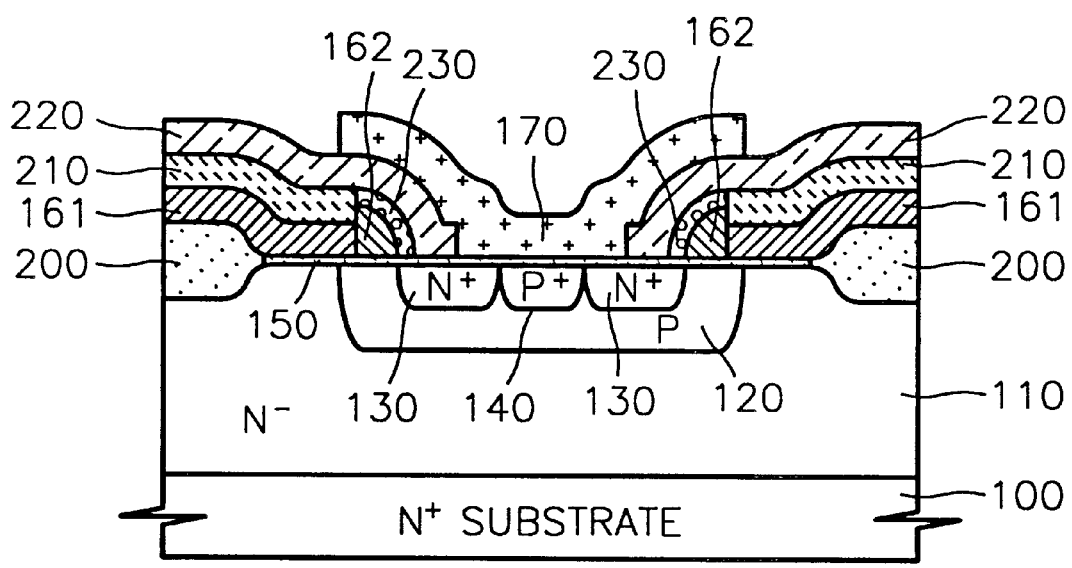

Referring to FIG. 17, an insulating layer pattern 220 is formed by depositing an insulating layer for insulating the gate electrode from the source electrode and patterning the insulating layer. After etching the fourth oxide layer 240 of FIG. 14 so as to partially expose the surface of the n-type high density source region 130 and the surface of the p-type high density source region 140 using the insulating layer pattern 220 as an etching mask, a source electrode 170 is formed.

Then, though not shown in the drawing, the DMOS field effect transistor according to the present invention is completed by forming a drain electrode so as to be electrically connected to the drain region and performing a passivation process.

What is claimed is:

1. A DMOS field effect transistor, comprising:
   a high density drain region of a first conductivity type;
   a drift region of the same conductivity type formed on the drain region;
   a gate electrode formed over the drift region, with a gate insulating layer interposed between the drift region and the gate electrode, the gate electrode including a gate conductive layer and a conductive spacer formed on the side wall of the gate conductive layer;
   a body region formed to have a second conductivity type which is opposite to the first conductive type, on part of the drift region so that the doping density under the conductive spacer is maintained to be uniform along the direction in which current flows;
   high density source regions of a first conductivity type formed in part of the body region; and
   a source electrode and a drain electrode formed to be electrically connected to the source region and the drain region, respectively.

2. The DMOS field effect transistor of claim 1, wherein the body region is formed to be self-aligned on the gate conductive layer.

3. The DMOS field effect transistor of claim 1, wherein the source regions are formed to be self-aligned in the conductive spacer.

4. The DMOS field effect transistor of claim 1, wherein the gate conductive layer and the conductive spacer are formed of a doped polysilicon layer.

5. The DMOS field effect transistor of claim 1, further comprising a high density sink region of a second conductive type formed in the body region to be adjacent to the source regions and to contact the source electrode.

6. A DMOS field effect transistor, comprising:

a high density buried layer of a first conductivity type formed on a semiconductor substrate;

a drift region of the same conductive type formed on the buried layer;

a gate electrode formed over the drift region, with a gate insulating layer interposed between the drift region and the gate electrode, the gate electrode including a gate conductive layer and a conductive spacer formed on the side wall of the gate conductive layer;

a body region formed to have a second conductivity type which is opposite to the first conductive type, on part of the drift region so that the doping density under the conductive spacer is maintained to be uniform along the direction in which current flows;

high density source regions of a first conductive type formed in part of the body region;

a sink region of a first conductivity type formed to be separated from the body region by a predetermined distance, to cross the drift region in a vertical direction, and to overlap part of the surface of the buried layer;

a high density drain region of a first conductivity type formed on a predetermined region of the surface of the sink region; and a source electrode and a drain electrode formed to be electrically connected to the source region and the drain region, respectively.

7. A method for manufacturing a DMOS field effect transistor, comprising the steps of:

(a) forming a high density drain region of a first conductivity type;

(b) forming a drift region of a first conductivity type on the drain region;

(c) forming a gate insulating layer on the drift region;

(d) forming a gate conductivity layer on the gate insulating layer;

(e) forming a body region of a second conductivity type which is opposite to the first conductivity type, using the gate conductive layer as an ion implantation mask;

(f) forming a conductive spacer on the side wall of the gate conductive layer;

(g) forming a mask layer pattern separated from the conductive spacer by a predetermined distance;

(h) forming a high density source region of a first conductivity type using the conductive spacer and the mask layer pattern as ion implantation masks; and (i) forming a source electrode and a drain electrode so as to be electrically connected to the source region and the drain region, respectively.

8. The method of claim 7, wherein the step (e) comprises the steps of:

implanting impurity ions of a second conductivity type using the gate conductive layer as an ion implantation mask; and drive-in-diffusing the impurity ions at a predetermined temperature for a predetermined time.

9. The method of claim 8, wherein the predetermined temperature is in the order of 950° C. and the predetermined time is in the order of 60 minutes.

10. The method of claim 7, wherein the step (f) comprises the steps of:

forming an oxide layer on the gate conductive layer;

forming a conductive material layer on the entire surface of the structure on which the oxide layer is formed; and forming a conductive spacer so as to be attached to the side wall of the gate conductive layer by etching back the conductive material layer using the oxide layer as an etching stopper.

11. The method of claim 10, wherein the gate conductive layer and the conductive spacer are formed of doped polysilicon layer.

12. The method of claim 7, further comprising the step of forming a high density source region of a second conductivity type in the body region to be adjacent to the high density source regions and to contact the source electrode in a predetermined region.

* * * * *